(12) United States Patent
Kuo et al.

(10) Patent No.: US 9,673,200 B2
(45) Date of Patent: Jun. 6, 2017

(54) SEMICONDUCTOR DEVICE STRUCTURE AND METHOD OF MANUFACTURING THE SAME

(71) Applicant: TAIWAN SEMICONDUCTOR MANUFACTURING CO., LTD., Hsinchu (TW)

(72) Inventors: Shih-Chi Kuo, Yangmei (TW); Tsung-Hsien Lee, Tainan (TW); Ta-Ching Wei, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/010,798

(22) Filed: Jan. 29, 2016

(65) Prior Publication Data

US 2016/0163715 A1 Jun. 9, 2016

Related U.S. Application Data

(62) Division of application No. 14/158,220, filed on Jan. 17, 2014, now Pat. No. 9,257,438.

(51) Int. Cl.
| | |
|---|---|
| *H01L 21/336* | (2006.01) |
| *H01L 27/11* | (2006.01) |
| *H01L 21/311* | (2006.01) |
| *H01L 21/3205* | (2006.01) |
| *H01L 21/027* | (2006.01) |
| *H01L 21/768* | (2006.01) |

(Continued)

(52) U.S. Cl.
CPC .......... *H01L 27/11* (2013.01); *H01L 21/0271* (2013.01); *H01L 21/0273* (2013.01); *H01L 21/31111* (2013.01); *H01L 21/31116* (2013.01); *H01L 21/31144* (2013.01); *H01L 21/32053* (2013.01); *H01L 21/76224* (2013.01); *H01L 21/76819* (2013.01); *H01L 21/76837* (2013.01); *H01L 21/823437* (2013.01); *H01L 21/823481* (2013.01); *H01L 27/1116* (2013.01)

(58) Field of Classification Search
CPC ............. H01L 27/115; H01L 21/76829; H01L 21/02362; H01L 27/11
USPC ......................................... 438/197
See application file for complete search history.

(56) References Cited

U.S. PATENT DOCUMENTS

| | | | | |
|---|---|---|---|---|
| 2005/0272217 | A1* | 12/2005 | Chiang | ............... H01L 27/0629 438/386 |
| 2010/0244132 | A1* | 9/2010 | Balch | .................. H01L 29/7843 257/347 |

(Continued)

*Primary Examiner* — Julia Slutsker
(74) *Attorney, Agent, or Firm* — Birch, Stewart, Kolasch & Birch, LLP

(57) ABSTRACT

A method for forming a semiconductor device structure is provided. The method includes forming a first gate stack structure and a second gate stack structure on a substrate, and the first gate stack structure includes a first spacer adjacent to the second gate stack structure. The method also includes forming an U-shaped capping layer between the first gate stack structure and the second gate stack structure, and a lateral sidewall of the U-shaped capping layer is in direct contact with the first spacer of the first gate stack structure. A top of the lateral sidewall of the U-shaped capping layer is below a top of the first spacer of the first gate stack structure.

17 Claims, 6 Drawing Sheets

(51) Int. Cl.
*H01L 21/762* (2006.01)
*H01L 21/8234* (2006.01)

(56) References Cited

U.S. PATENT DOCUMENTS

| | | | |
|---|---|---|---|
| 2011/0095394 A1* | 4/2011 | Chih | H01L 23/5252 257/530 |
| 2011/0101461 A1 | 5/2011 | Takeuchi et al. | |
| 2012/0104500 A1* | 5/2012 | Cai | H01L 21/823481 257/368 |

* cited by examiner

SEMICONDUCTOR DEVICE STRUCTURE AND METHOD OF MANUFACTURING THE SAME

CROSS REFERENCE TO RELATED APPLICATIONS

This application is a Divisional application of co-pending U.S. application Ser. No. 14/158,220, filed on Jan. 17, 2014, the entire content of which is hereby incorporated by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Static Random Access Memory (SRAM) is chosen as a reliable, proven technology for high-performance stand-alone memory devices or embedded memory devices. The advantages of an SRAM include fast access speed, low power consumption, high noise margin, and process compatibility with a CMOS fabrication process. However, there are many challenges related to fabricating SRAM.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
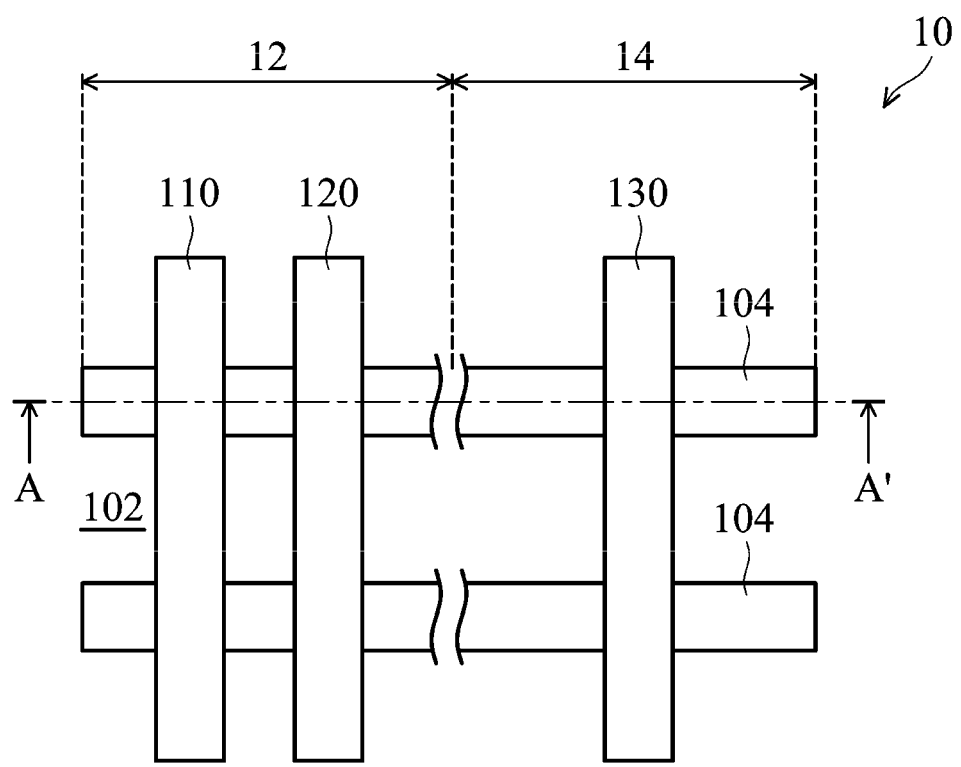
FIG. 1 shows a top-view representation of a semiconductor device structure, in accordance with some embodiments of the disclosure.

Embodiments for forming a semiconductor device structure are provided. FIG. 1 shows a top-view representation of a semiconductor device structure 10, in accordance with some embodiments of the disclosure. However, it should be noted that FIG. 1 has been simplified for the sake of clarity to better understand the inventive concepts of the disclosure. Additional features can be added to semiconductor device structure 10, and some of the features below can be replaced or eliminated.

Referring to FIG. 1, a substrate 102 is provided. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

As shown in FIG. 1, substrate 102 has a cell region 12 and a logic region 14. Cell region 12 is used to form static random access memory (SRAM). In some embodiments, isolation feature 104, such as shallow trench isolation (STI) features or local oxidation of silicon (LOCOS) features, is formed in substrate 102. Isolation feature 104 may define and isolate various integrated circuit devices. In some embodiments, at cell region 12, a first gate stack structure 110 and a second gate stack structure 120 are formed on substrate 102. At logic region 14, third gate stack structure 130 is formed on substrate 102. The structure of first gate stack structure 110, second gate stack structure 120 and third gate stack structure 130 are described in detail below.

FIGS. 2A-2I show cross-sectional representations of various stages of forming a semiconductor device structure 10, in accordance with some embodiments of the disclosure.

Figure 2A:
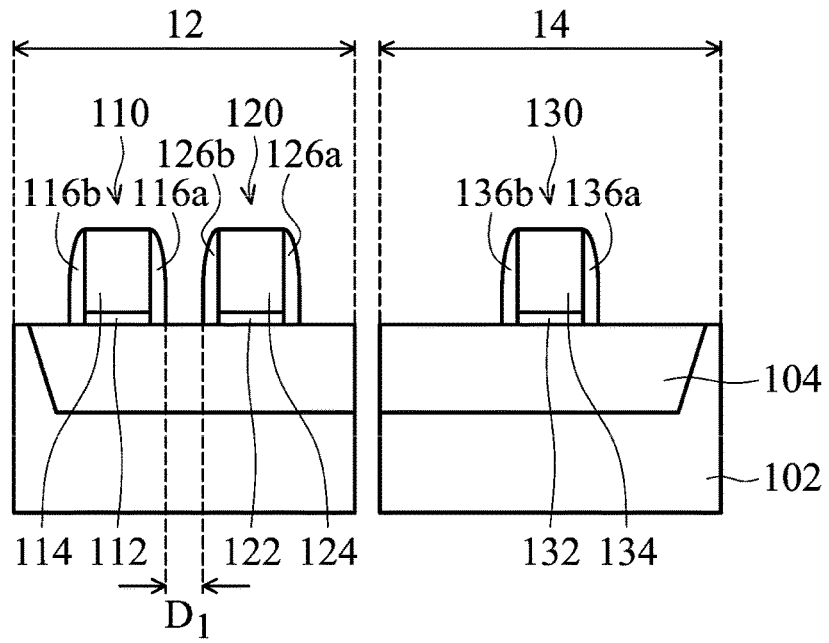
FIGS. 2A-2I show cross-sectional representations of various stages of forming a semiconductor device structure, in accordance with some embodiments of the disclosure.

FIGS. 2A-2I are cross-sectional representations taken along AA' line of FIG. 1. As shown in FIG. 2A, first gate stack structure 110, second gate stack structure 120 and third gate stack structure 130 are formed on isolation feature 104. In some embodiments, first gate stack structure 110 is adjacent to second gate stack structure 120.

First gate stack structure 110 includes a gate dielectric layer 112, a gate electrode layer 114 and gate spacers 116. Gate dielectric layer 112 is made of silicon oxide, silicon nitride, or a high dielectric constant material (high-k material). In some embodiments, gate dielectric layer 112 is formed by a chemical vapor deposition (CVD) process.

Gate electrode layer 114 is formed on gate dielectric layer 112. Gate electrode layer 114 is made of polysilicon or conductive material. The conductive material may include metal (e.g., tantalum, titanium, molybdenum, tungsten, platinum, aluminum, hafnium, ruthenium), a metal silicide (e.g., titanium silicide, cobalt silicide, nickel silicide, tantalum silicide), or a metal nitride (e.g., titanium nitride, tantalum nitride). In some embodiments, gate electrode layer 114 is formed by a chemical vapor deposition (CVD) process or a physical vapor deposition (PVD) process.

Gate spacers 116 including a first spacer 116a and a second spacer 116b are formed on sidewalls of gate electrode layer 114. In some embodiments, gate spacers 116 are made of silicon oxide, silicon nitride, silicon oxynitride or other applicable material. In some embodiments, gate spacers 116 are formed by a chemical vapor deposition (CVD) process or physical vapor deposition (PVD) process.

Similar to first gate stack structure 110, second gate stack structure 120 includes a gate dielectric layer 122, a gate electrode layer 124 and gate spacers 126. Gate spacers 126 include a first gate spacer 126a and a second gate spacer 126b.

Similar to first gate stack structure 110, third gate stack structure 130 includes a gate dielectric layer 132, a gate electrode layer 134 and gate spacers 136. Gate spacers 136 include a first gate spacer 126a and a second gate spacer 126b.

As shown in FIG. 2A, there is a distance $D_1$ between first gate stack structure 110 and second gate stack structure 120. More specifically, the distance $D_1$ is between first spacer 116a of first gate stack structure 110 and second spacer 126b of second gate stack structure 120. In some embodiments, the distance $D_1$ is in a range from about 90 nm to about 120 nm.

In some embodiments, well regions (not shown) are also formed within the substrate 102. The well regions may be an N-type or P-type well depending on the dopant used in the well. For example, an N-type well containing one of the group V elements, such as phosphorus (P) or arsenic (As), can be formed by implantation. A P-type well containing one of the group III elements, such as boron (B) or gallium (Ga), can be formed within the substrate by implantation, for example.

Figure 2B:
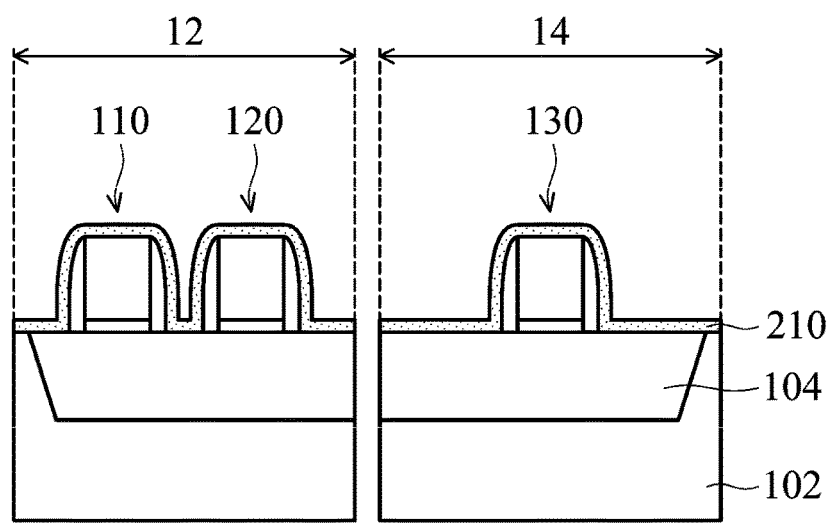

After first gate stack structure 110, second gate stack structure 120 and third gate stack structure 130 are formed on isolation feature 104, a capping layer 210 is conformally forming on first gate stack structure 110, second gate stack structure 120 and third gate stack structure 130 as shown in FIG. 2B in accordance with some embodiments of the disclosure. In some embodiments, capping layer 210 is made of silicon nitride or tetraethylorthosilicate (TEOS) or silicon oxide ($SiO_2$). In some embodiments, capping layer 210 is a single layer or a multi-layer. In some embodiments, capping layer 210 is formed by a chemical vapor deposition (CVD) process or a spin-coating process.

Figure 2C:
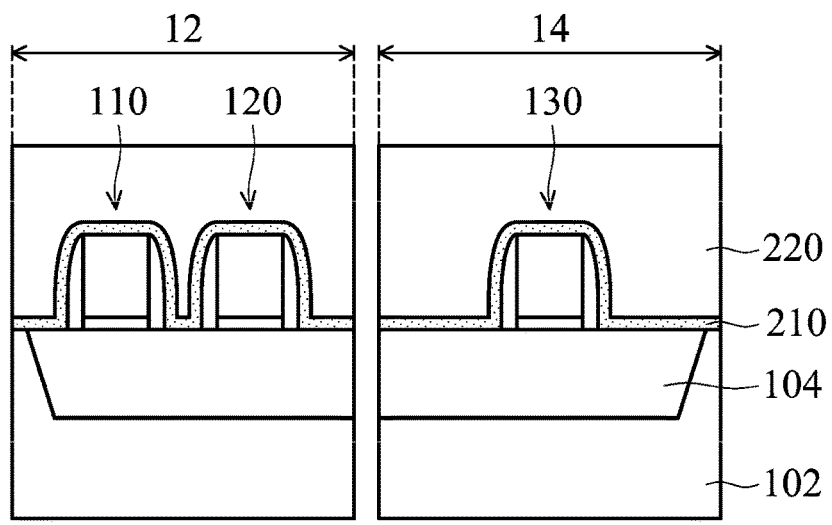

After capping layer 210 is formed, a photoresist layer 220 is formed on capping layer 210 in FIG. 2C in accordance with some embodiments of the disclosure. Photoresist layer 220 may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

Figure 2D:
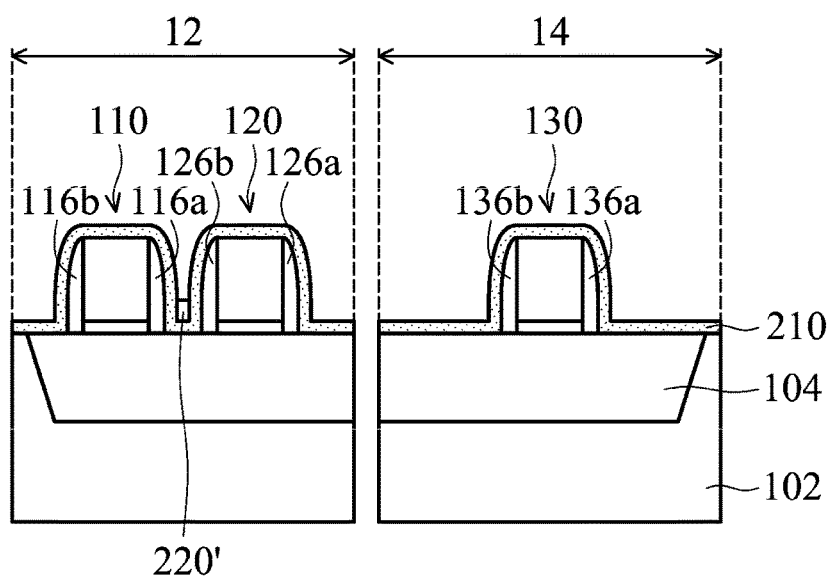

After photoresist layer 220 is formed, an etching process is performed to remove a portion of photoresist layer 220 as shown in FIG. 2D in accordance with some embodiments of the disclosure. As a result, a portion of photoresist layer 220 remains.

As shown in FIG. 2D, a portion of photoresist layer 220 is removed, but another portion of photoresist layer 220 are left between first gate stack structure 110 and second gate stack structure 120. As a result, a remaining photoresist layer 220' is obtained.

It should be noted that, compared with photoresist layer 220 located at other regions, remaining photoresist layer 220' located between first gate stack structure 110 and second gate stack structure 120 is difficult to remove, because the distance $D_1$ between first gate stack structure 110 and second gate stack structure 120 is relatively short. The removal rate (or etching rate) of photoresist layer 220 between first gate stack structure 110 and second gate stack structure 120 is relatively lower. Therefore, the amount of remaining photoresist layer 220' is controlled by changing the operating time of the etching process.

In some embodiments, remaining photoresist layer 220' has a height that is less than half the height of first spacer 116a of first gate stack structure 110. In some embodiments, photoresist layer 220 is removed by a dry etching process.

Figure 2E:
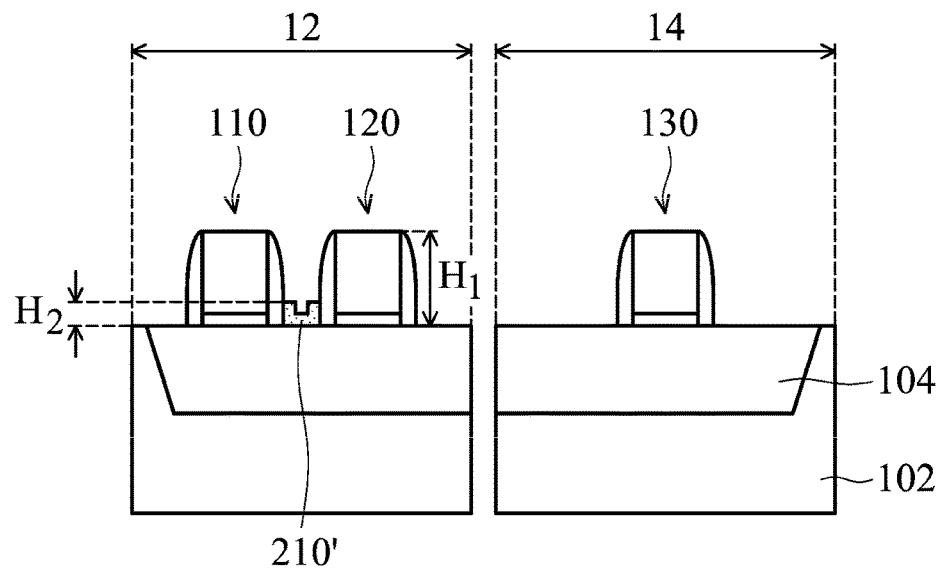

After remaining photoresist layer 220' is formed, most of capping layer 210 is removed as shown in FIG. 2E in accordance with some embodiments of the disclosure. In some embodiments, remaining photoresist layer 220' is used as a mask to protect a portion of capping layer 21.

It should be noted that, because a portion of capping layer 210 is covered by remaining photoresist layer 220', capping layer 210 is not removed completely. As a result, a remaining capping layer 210' is obtained. In some embodiments, remaining capping layer 210' has a U-shape. Remaining capping layer 210' is configured to protect the isolation feature 104 below capping layer 210' from being etched by a subsequent process (described later).

In some embodiments, remaining capping layer 210' has a height ($H_2$) that is less than half the height ($0.5\,H_1$) of first spacer 116a of first gate stack structure 110.

Figure 2F:
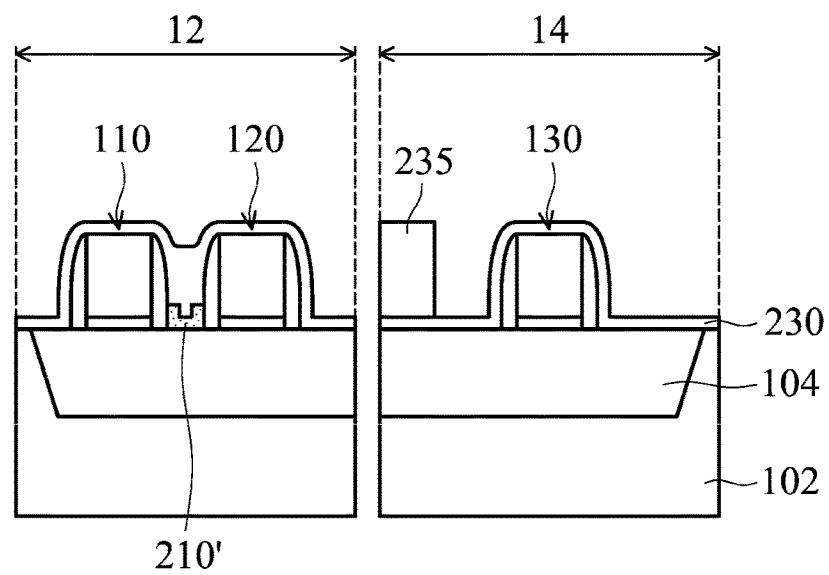

After remaining capping layer 210' is formed, a resist protective oxide (RPO) layer 230 is formed on first gate stack structure 110, second gate stack structure 120 and third gate stack structure 130 as shown in FIG. 2F in accordance with some embodiments of the disclosure. RPO layer 230 is configured to protect underlying layers from being exposed in a subsequent salicidation process.

In some embodiments, RPO layer 230 is made of oxide, such as silicon oxide, silicon oxynitride, oxygen-doped silicon nitride. In some embodiments, RPO layer 230 is formed by a chemical vapor deposition (CVD) process or physical vapor deposition (PVD) process.

After RPO layer 230 is formed, a second photoresist layer 235 is formed on RPO layer 230 as shown in FIG. 2F in accordance with some embodiments of the disclosure. Afterwards, second photoresist layer 235 is patterned by a patterning process to form a patterned second photoresist layer 235. Patterned second photoresist layer 235 is used as a mask and used to protect a portion of RPO layer 230 from being removed. The patterning process includes a photolithography process and an etching process. The photolithography process include photoresist coating (e.g., spin-on coating), soft baking, mask aligning, exposure, post-exposure baking, developing the photoresist, rinsing, and drying (e.g., hard baking). The etching process includes a dry etching process or a wet etching process.

Figure 2G:
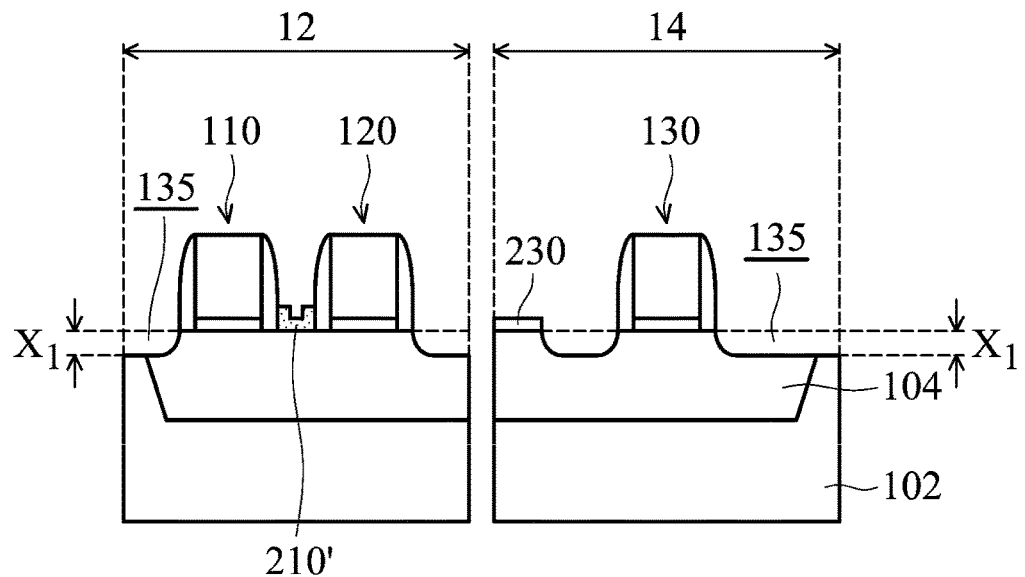

After patterned second photoresist layer 235 is formed, a portion of RPO layer 230 is removed as shown in FIG. 2G in accordance with some embodiments of the disclosure.

In some embodiments, a portion of RPO layer 230 is removed by an etching process, such as a dry etching process or a wet etching process. In some embodiments, a dry etching process includes an etching gas, such as $CF_4$, $CH_3F$ or $C_5F_8$ and an additive gas, such as $N_2$, Ar, and/or $O_2$. In some embodiments, a wet etching process includes dilute HF and/or an aqueous buffered HF solution.

It should be noted that, in order to ensure that portion of RPO layer 230 which is expected to be removed are removed completely, an over-etching process is performed, in some embodiments. As a result, a portion of isolation feature 104 may be over-etched to form recesses 135. In other words, a portion of isolation feature 104 which is not covered by remaining capping layer 210' is recessed. For example, a portion of isolation feature 104 adjacent to third gate stack structure 130 at logic region 14 is lower than a top surface of isolation feature 104 between first gate stack structure 110 and second gate stack structure 120. In some embodiments, recesses 135 have a depth $X_1$ which is below a top surface of substrate 102 in a range from about 0.1 nm to about 60 nm.

In some embodiments, if the recesses or trenches are formed between first gate stack structure 110 and second gate stack structure 120, it is difficult to fill a dielectric layer, such as an inter-layer dielectric layer (ILD), into the recesses or trenches. As a result, after the contact structure formation process is performed, conductive material may be formed in isolation feature 104. Therefore, short circuiting and metal bridge problems may occur. In addition, the short circuiting and metal bridge problems become more serious as the dimensions of first gate stack structure 110 and second gate stack structure 120 are gradually decreased. In order to overcome this problem, U-shaped capping layer 210' is formed between first gate stack structure 110 and second gate stack structure 120 to prevent underlying isolation feature 104 from being etched when RPO layer 230 is removed.

As shown in FIG. 2G, after the etching process, the isolation feature 104 between first gate stack structure 110 and second gate stack structure 120 has a substantially planar topography due to protection of remaining capping layer 210'. In other words, a top surface of the isolation feature 104 below remaining capping layer 210' is higher than the top surface of isolation feature 104 which is not covered by remaining capping layer 210'. In addition, in some embodiments, a portion of isolation feature 104 adjacent to third gate stack structure 130 is lower than the top surface of isolation feature 104 between first gate stack structure 110 and second gate stack structure 120.

Figure 2H:
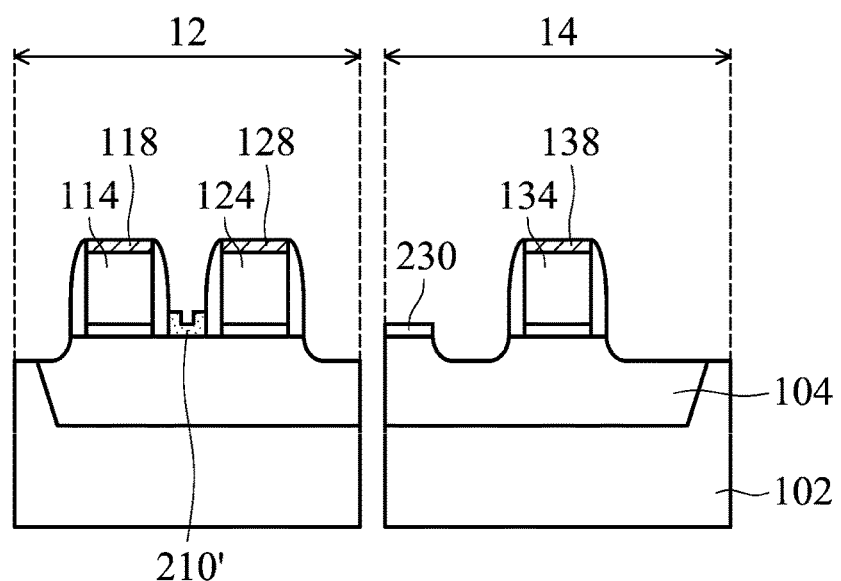

After RPO layer 230 is removed, first metal silicide layer 118 is formed on first gate stack structure 110 as shown in FIG. 2H in accordance with some embodiments of the disclosure. Similar to first metal silicide layer 118, second metal silicide layer 128 and third metal silicide layer 138 are respectively formed on second gate stack structure 120 and third gate stack structure 130.

For example, a metal film is deposited on gate electrode layer 114 to be in direct contact with the exposed silicon surface of gate electrode layer 114. Any suitable process, such as a PVD process, CVD process, plating process, electroless plating process, and the like, may be performed to form the metal film. Afterwards, a heating operation is then carried out to cause a reaction between the deposited metal film and the exposed silicon surface, therefore forming first metal silicide layer 118. The un-reacted portion of the deposited metal film is then removed, for example, by using an etching process. First metal silicide layer 118 has a lower resistance than non-silicided regions, especially in smaller geometries.

Figure 2I:
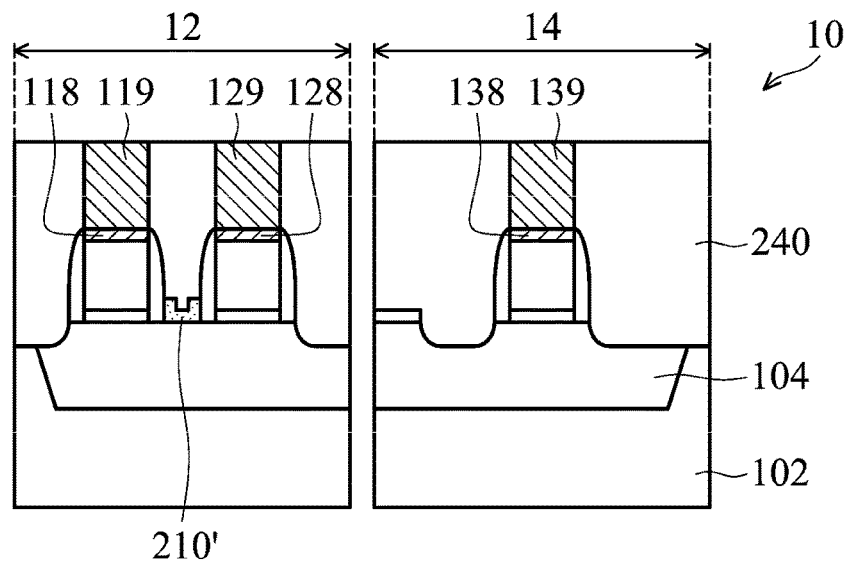

In some embodiments, first metal silicide layer 118, second metal silicide layer 128 and third metal silicide layer 138 are formed simultaneously. Afterwards, an inter-layer dielectric (ILD) layer 240 is formed on substrate 102 as shown in FIG. 2I in accordance with some embodiments of the disclosure.

ILD layer 240 may include any suitable material, such as a silicon oxide, silicon oxynitride, borosilicate glass (BSG), phosphoric silicate glass (PSG), borophosphosilicate glass (BPSG), fluorinated silicate glass (FSG), low-k material, porous dielectric material, and/or combinations thereof. Examples of low-k dielectric materials may include, but are not limited to, fluorinated silica glass (FSG), carbon doped silicon oxide, amorphous fluorinated carbon, parylene, bis-benzocyclobutenes (BCB), or polyimide. In some embodiments, ILD layer 240 is formed by a chemical vapor deposition (CVD) process, physical vapor deposition (PVD) process or spin-on process.

Afterwards, an opening (not shown) is formed in ILD layer 240, and a conductive material is filled into the opening to form first contact structure 119, second contact structure 129 and third contact structure 139. First contact structure 119 is in direct contact with first metal silicide layer 118, and second contact structure 129 and third contact structure 139 are respectively in direct contact with second metal silicide layer 128 and third metal silicide layer 138. Contact structures 119,129 and 139 are made of conductive materials, such as copper (Cu), copper alloy, aluminum (Al), aluminum alloy, tungsten (W), tungsten alloy, titanium (Ti), titanium alloy, gold (Au), gold alloy, tantalum (Ta) or tantalum alloy. As a result, semiconductor device structure 10 is formed. Afterwards, substrate 102 may continue with other processes to form other devices, such as inter-metal dielectric (IMD) layers or interconnect structures.

In addition, contact structures 119,129 and 139 may further include a liner and/or a barrier layer. For example, a liner (not shown) may be formed over the dielectric layer in the openings, and the liner covers the sidewalls and bottom of the opening. The liner may be either tetraethylorthosilicate (TEOS) or silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used.

The barrier layer (not shown) may be formed over the liner (if present) and may cover the sidewalls and bottom of the opening. The barrier layer may be made of tantalum nitride, although other materials, such as tantalum, titanium, titanium nitride, or the like, may also be used. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes.

The advantage of embodiments of the disclosure is that remaining capping layer 210' is used as a protective layer to protect underlying isolation feature 104 from being etched. Afterwards, no voids or recesses are formed in ILD layer 240 between first gate stack structure 110 and second gate stack structure 120. Since no voids or recesses are formed in ILD layer 240, the metal bridge phenomenon is avoided after the contact structure formation process.

Figure 3:
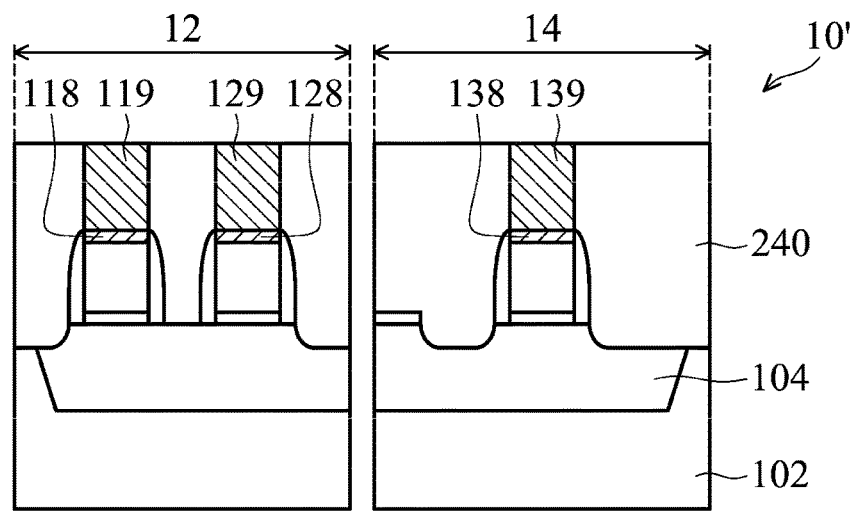
FIG. 3 shows a cross-sectional representation of a semiconductor device structure, in accordance with some embodiments of the disclosure.

FIG. 3 shows a cross-sectional representation of a semiconductor device structure 10', in accordance with some embodiments of the disclosure. FIG. 3 is similar to FIG. 2I, the difference being that no capping layer 210 is formed between first gate stack structure 110 and a second gate stack structure 120 in FIG. 3. More specifically, in some embodiments, remaining capping layer 210' shown in FIG. 2H is removed after first metal silicide layer 118 is formed. Afterwards, ILD layer 240 and contact structures 119, 129 and 139 are subsequently formed to obtain the semiconductor device structure 10'.

Embodiments for forming a semiconductor device structure are provided. An isolation feature is formed in a substrate. A first gate stack structure and a second gate stack structure are formed on the isolation feature. A capping layer is formed between the first gate stack structure and the second gate stack structure to use as a protective layer. Therefore, the isolation feature underlying the capping layer is protected from being etched when a resist protective oxide (RPO) layer formed on the first gate stack structure and the second gate stack structure is removed. As a result, short circuiting and metal bridge problems are avoided. In addition, the performance of semiconductor device structure is further improved.

In some embodiments, a method for forming a semiconductor device structure is provided. The method includes forming a first gate stack structure and a second gate stack structure on a substrate, and the first gate stack structure comprises a first spacer adjacent to the second gate stack structure. The method also includes forming an U-shaped capping layer between the first gate stack structure and the second gate stack structure. A lateral sidewall of the U-shaped capping layer is in direct contact with the first spacer of the first gate stack structure, and a top of the lateral sidewall of the U-shaped capping layer is below a top of the first spacer of the first gate stack structure. In some embodiments, a method for forming a semiconductor device structure is provided. The method includes forming an isolation feature in a substrate and forming a first gate stack structure and a second gate stack structure on the isolation feature. The method also includes conformally depositing a capping layer on the first gate stack structure and the second gate stack structure. The method also includes removing a portion of the capping layer to form a remaining capping layer between first gate stack structure and the second gate stack structure. The remaining capping layer is configured to protect a portion of the isolation feature which is directly below the remaining capping layer from being etched In some embodiments, a method for forming a semiconductor device structure is provided. The method includes providing a substrate and forming an isolation feature in the substrate. The method also includes forming a first gate stack structure and a second gate stack structure on the isolation feature and conformally depositing a capping layer on the first gate stack structure and the second gate stack structure. The method further includes removing a portion of the capping layer to form a remaining capping layer between first gate stack structure and the second gate stack structure. The method includes forming a resist protective oxide (RPO) layer on the first gate stack structure, the second gate stack structure and the remaining capping layer. The method also includes removing a portion of the RPO layer. The isolation feature between the first gate stack structure and the second gate stack structure is protected by the remaining capping layer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor device structure, comprising:
    forming an isolation feature in a substrate;
    forming a first gate stack structure and a second gate stack structure on the substrate, wherein the first gate stack structure comprises a first spacer adjacent to the second gate stack structure;
    forming an U-shaped capping layer between the first gate stack structure and the second gate stack structure, wherein a lateral sidewall of the U-shaped capping layer is in direct contact with the first spacer of the first gate stack structure, and a top of the lateral sidewall of the U-shaped capping layer is below a top of the first spacer of the first gate stack structure;
    forming a resist protective oxide (RPO) layer on the first gate stack structure, the second gate stack structure and the U-shaped capping layer; and
    removing a portion of the RPO layer to form a remaining RPO layer, wherein while removing the portion of the RPO layer, a portion of the isolation feature which is not covered by the U-shaped capping layer is recessed.

2. The method for forming the semiconductor device structure as claimed in claim 1, further comprising:
    forming an isolation feature in the substrate and below the first gate stack structure and the second gate stack structure, wherein the U-shaped capping layer is configured to protect the underlying isolation feature.

3. The method for forming the semiconductor device structure as claimed in claim 1, wherein forming the U-shaped capping layer between the first gate stack structure and the second gate stack structure comprises:

conformally depositing a capping layer on the first gate stack structure and the second gate stack structure;

forming a photoresist layer on the first gate stack structure and the second gate stack structure;

removing a portion of the photoresist layer to form a remaining photoresist layer;

removing a portion of the capping layer by using the remaining photoresist layer as a mask to form the U-shape capping layer between first gate stack structure and the second gate stack structure.

4. The method for forming the semiconductor device structure as claimed in claim 1, further comprising:

after removing the portion of the RPO layer, forming a first metal silicide layer on the first gate stack structure and a second metal silicide layer on the second gate stack structure.

5. The method for forming the semiconductor device structure as claimed in claim 1, wherein removing the portion of the RPO layer comprises performing a wet etching process or a dry etching process.

6. The method for forming the semiconductor device structure as claimed in claim 1, wherein the entire U-shaped capping layer has a height that is less than half of height of the first spacer of the first gate stack structure.

7. The method for forming the semiconductor device structure as claimed in claim 1, wherein the first gate stack structure further comprises a first gate dielectric layer and a first gate electrode layer, and a top surface of the U-shaped capping layer is higher than a top surface of the gate dielectric layer.

8. A method for forming a semiconductor device structure, comprising:

forming an isolation feature in a substrate;

forming a first gate stack structure and a second gate stack structure on the isolation feature;

conformally depositing a capping layer on the first gate stack structure and the second gate stack structure;

removing a portion of the capping layer to form a remaining capping layer between first gate stack structure and the second gate stack structure, wherein the remaining capping layer is configured to protect a portion of the isolation feature which is directly below the remaining capping layer from being etched;

forming a resist protective oxide (RPO) layer on the first gate stack structure, the second gate stack structure and the remaining capping layer;

removing a portion of the RPO layer to form a remaining RPO layer; and recessing a portion of the isolation feature by using the remaining RPO layer as a mask.

9. The method for forming the semiconductor device structure as claimed in claim 8, wherein removing the portion of the capping layer to form the remaining capping layer comprises:

forming a photoresist layer on the first gate stack structure and the second gate stack structure; and removing a portion of the photoresist layer to form a remaining photoresist layer; and removing the portion of the capping layer by using the remaining photoresist layer as a mask to form the remaining capping layer.

10. The method for forming the semiconductor device structure as claimed in claim 8, wherein a lateral sidewall of the remaining capping layer is in direct contact with a first spacer of the first gate stack structure.

11. The method for forming the semiconductor device structure as claimed in claim 8, wherein the remaining capping layer has a height that is less than half of height of the first spacer of the first gate stack structure.

12. The method for forming the semiconductor device structure as claimed in claim 8, further comprising:

after recessing the portion of the isolation feature, forming a first metal silicide layer on the first gate stack structure and a second metal silicide layer on the second gate stack structure.

13. The method for forming the semiconductor device structure as claimed in claim 8, wherein the first gate stack structure comprises a first gate dielectric layer and a first gate electrode layer, and a top surface of the remaining capping layer is higher than a top surface of the gate dielectric layer.

14. A method for forming a semiconductor device structure, comprising:

providing a substrate;

forming an isolation feature in the substrate;

forming a first gate stack structure and a second gate stack structure on the isolation feature;

conformally depositing a capping layer on the first gate stack structure and the second gate stack structure;

removing a portion of the capping layer to form a remaining capping layer between first gate stack structure and the second gate stack structure;

forming a resist protective oxide (RPO) layer on the first gate stack structure, the second gate stack structure and the remaining capping layer; and removing a portion of the RPO layer, wherein the isolation feature between the first gate stack structure and the second gate stack structure is protected by the remaining capping layer, and while removing the portion of the RPO layer, a portion of the isolation feature which is not covered by the remaining capping layer is recessed.

15. The method for forming the semiconductor device structure as claimed in claim 14, wherein removing a portion of the capping layer to form the remaining capping layer comprises:

forming a photoresist layer on the first gate stack structure and the second gate stack structure; and removing a portion of the photoresist layer to form a remaining photoresist layer; and removing a portion of the capping layer by using the remaining photoresist layer as a mask to form the remaining capping layer, wherein the remaining capping layer is formed between the first gate stack structure and the second gate stack structure.

16. The method for forming the semiconductor device structure as claimed in claim 14, wherein removing a portion of the RPO layer comprises performing a wet etching process or a dry etching process.

17. The method for forming the semiconductor device structure as claimed in claim 14, further comprising:

after removing a portion of the RPO layer, forming a metal silicide layer on the first gate stack structure.

* * * * *